(12) United States Patent
Takeda et al.

(10) Patent No.: US 7,612,363 B2
(45) Date of Patent: Nov. 3, 2009

(54) N-TYPE GROUP III NITRIDE SEMICONDUCTOR STACKED LAYER STRUCTURE

(75) Inventors: Hitoshi Takeda, Ichihara (JP); Hisayuki Miki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 67 days.

(21) Appl. No.: 11/661,757

(22) PCT Filed: Sep. 13, 2005

(86) PCT No.: PCT/JP2005/017243

§ 371 (c)(1),
(2), (4) Date: Mar. 2, 2007

(87) PCT Pub. No.: WO2006/030950

PCT Pub. Date: Mar. 23, 2006

(65) Prior Publication Data

US 2008/0093621 A1    Apr. 24, 2008

Related U.S. Application Data

(60) Provisional application No. 60/611,285, filed on Sep. 21, 2004.

(30) Foreign Application Priority Data

Sep. 14, 2004    (JP)    ............... 2004-267294

(51) Int. Cl.
| | | |
|---|---|---|
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/24 | (2006.01) |
| H01L 33/00 | (2006.01) |

(52) U.S. Cl. .................. 257/14; 257/15; 257/18; 257/21; 257/103; 257/E33.008; 257/E33.012; 257/E33.025; 257/E33.03; 257/E33.033; 257/E33.034

(58) Field of Classification Search ............... 257/21, 257/103, 14–15, 18, E33.008, E33.012, E33.025, 257/E33.03, E33.033, E33.034
See application file for complete search history.

(56) References Cited

U.S. PATENT DOCUMENTS 6,064,079 A * 5/2000 Yamamoto et al. .......... 257/101

(Continued)

FOREIGN PATENT DOCUMENTS

EP    1 014 455 A1    6/2000

(Continued)

OTHER PUBLICATIONS

Shuji Nakamura "InGaN Multiquantum-Well-Structure Laser Diodes With GaN-AlGaN Modulation-Doped Strained-Layer Superlattices" IEEE Journal of Selected Topics in Quantum Electronics vol. 4, No. 3 May/Jun. 1998, pp. 483-489.

*Primary Examiner*—Ida M Soward
(74) *Attorney, Agent, or Firm*—Sughrue Mion, PLLC

(57) ABSTRACT

An n-type Group III nitride semiconductor stacked layer structure including a first n-type layer which includes a layer containing n-type impurity atoms at a high concentration and a layer containing n-type impurity atoms at a low concentration, a second n-type layer containing n-type impurity atoms at an average concentration smaller than that of the first n-type layer, the second n-type layer neighboring the layer containing n-type impurity atoms at a low concentration in the first n-type layer.

24 Claims, 3 Drawing Sheets

U.S. PATENT DOCUMENTS

| | | | |
|---|---|---|---|
| 6,100,586 A * | 8/2000 | Chen et al. | 257/745 |
| 6,423,986 B1 * | 7/2002 | Zhao | 257/138 |
| 6,838,705 B1 * | 1/2005 | Tanizawa | 257/101 |
| 6,849,864 B2 * | 2/2005 | Nagahama et al. | 257/22 |
| 6,927,412 B2 * | 8/2005 | Takahashi et al. | 257/13 |
| 6,936,838 B2 * | 8/2005 | Kim | 257/14 |
| 6,949,774 B2 * | 9/2005 | Parikh et al. | 257/104 |
| 7,084,441 B2 * | 8/2006 | Saxler | 257/243 |
| 7,193,246 B1 | 3/2007 | Tanizawa et al. | |
| 7,282,760 B2 * | 10/2007 | Hoshino et al. | 257/328 |
| 7,456,445 B2 * | 11/2008 | Takeda et al. | 257/200 |
| 2002/0158251 A1 * | 10/2002 | Takahashi et al. | 257/70 |
| 2004/0119067 A1 * | 6/2004 | Weeks et al. | 257/40 |

FOREIGN PATENT DOCUMENTS

| | | |
|---|---|---|
| JP | 11-214798 A | 8/1999 |
| JP | 2000-236142 A | 8/2000 |
| JP | 2002-244072 A | 9/2000 |
| JP | 200317420 A | 1/2003 |
| JP | 2003-163418 A | 6/2003 |
| JP | 2003-218469 A | 7/2003 |
| WO | 99/46822 | 9/1999 |

* cited by examiner

N-TYPE GROUP III NITRIDE SEMICONDUCTOR STACKED LAYER STRUCTURE

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/611,285 filed on Sep. 21, 2004, pursuant to 35 U.S.C. §111(b).

TECHNICAL FIELD

The present invention relates to an n-type Group III nitride semiconductor stacked layer structure and to a Group III nitride semiconductor light-emitting device including the semiconductor stacked layer structure.

BACKGROUND ART

Conventionally, a Group III nitride semiconductor formed on a substrate has been used as a functional material for fabricating pn-junction Group III nitride semiconductor light-emitting devices which emit visible light of short wavelength such as light-emitting diodes (LEDs) and laser diodes (LDs) (see, for example, Japanese Patent Application Laid-Open (kokai) No. 2000-332364). For example, in fabrication of an LED emitting near-UV light, blue light, or green light, n-type or p-type aluminum gallium nitride ($Al_XGa_YN$, $0 \leq X$, $Y \leq 1$, $X+Y=1$) is employed for forming a cladding layer (see, for example, Japanese Patent Application Laid-Open (kokai) No. 2003-229645). Similarly, gallium indium nitride ($Ga_Y In_Z N$, $0 \leq Y$, $Z \leq 1$, $Y+Z=1$) is employed for fabricating a light-emitting layer (see, for example, Japanese Patent Publication (kokoku) No. 55-3834).

Generally, in conventional Group III nitride semiconductor light-emitting devices, an n-type or a p-type Group III nitride semiconductor layer serving as a cladding layer is joined to a light-emitting layer, in order to fabricate a light-emitting member having a hetero-junction structure for attaining high emission intensity. For example, in order to fabricate a light-emitting member having a doublehetero-junction structure, the light-emitting layer is composed of a semiconductor such as $Ga_Y In_Z N$ ($0 \leq Y$, $Z \leq 1$, $Y+Z=1$), to which an n-type or a p-type Group III nitride semiconductor layer serving as a cladding layer is joined (see, for example, a book written and edited by Isamu AKASAKI, "Group III-V Compound Semiconductors," published Baifukan Co., Ltd., Chapter 13, May 20 (1995)).

Conventionally, an n-type Group III nitride semiconductor layer interposed between, for example, a substrate and a light-emitting layer, is usually formed from a silicon (Si)-doped Group III nitride semiconductor. In this connection, a semiconductor layer; for example, an Si-doped n-type $Al_X Ga_Y N$ ($0 \leq X$, $Y \leq 1$, $X+Y=1$) layer having a resistivity controlled through modification of the amount of silicon (Si) as a dopant, is employed (see, for example, Japanese Patent No. 3383242).

From the standpoint of maintaining stable crystallinity and electric properties up to a relatively high concentration, Si is frequently used as an n-type impurity accompanied, however, by a problem of causing cracks when having been doped in large amounts. As n-type impurities other than silicon, on the other hand, there have been known germanium (Ge), sulfur (S), tin (Sn), selenium (Se) and tellurium (Te) (see, for example, Japanese Patent Application Laid-Open (kokai) No. 4-170397 and Japanese Patent No. 3504976). When compared with the case of Si, however, the doping efficiency is low, which is not advantageous for obtaining an n-type Group III nitride semiconductor layer of a low resistance. For example, when doped with Ge at a high concentration to obtain an n-type Group III nitride semiconductor layer of a low resistance, there occurs a defect of generating small holes (pits), in the surface of the n-type Group III nitride semiconductor layer, to impair the flatness.

When a device is produced by forming a light-emitting layer or other pn junction on a layer that is doped with n-type impurities, the generation of pits, even when they are tiny, triggers a problem of leakage of current and deteriorates an electrostatic breakdown voltage.

To improve the electrostatic breakdown voltage, there has been known an art of which the essential point is that "the n-side nitride semiconductor layer includes n-side multiplicity of layers formed by the lamination of at least two kinds of nitride semiconductor layers having the same composition and being doped with the n-type impurities at different concentrations" (see Japanese Patent No. 3063756). In this patent document, the effect of the plurality of layers forming the n-side multiplicity of layers doped at different concentrations is that "crystal defects occurring from the substrate can be terminated, and the crystallinity can be improved in the layer grown on the multiplicity of layers". That is, what is intended to be decreased by this technology is the dislocation occurring from the substrate but not the dislocation or pits occurring in the layer of a high impurity concentration in the n-type semiconductor layer itself. In this technology, the n-side multiplicity of layers start with an undoped layer and terminate with a layer of a high impurity concentration where the dislocation and pits tend to occur.

DISCLOSURE OF INVENTION

It is an object of the present invention to provide an n-type Group III nitride semiconductor stacked layer structure of a low resistance having excellent flatness generating few cracks and pits in the uppermost surface, and to provide a Group III nitride semiconductor light-emitting device, which uses it, featuring a low forward voltage, an excellent light-emitting efficiency, a high reverse voltage and an excellent electrostatic breakdown voltage.

The present invention provides the following:

(1) An n-type Group III nitride semiconductor stacked layer structure comprising a first n-type layer which includes a layer containing n-type impurity atoms at a high concentration and a layer containing n-type impurity atoms at a low concentration, a second n-type layer containing n-type impurity atoms at an average concentration smaller than that of the first n-type layer, the second n-type layer neighboring the layer containing n-type impurity atoms at a low concentration in the first n-type layer.

(2) An n-type Group III nitride semiconductor stacked layer structure according to (1) above, wherein the layers containing n-type impurity atoms at a high concentration and the layers containing n-type impurities at a low concentration alternately and periodically exist in the first n-type layer.

(3) An n-type Group III nitride semiconductor stacked layer structure according to (1) or (2) above, wherein the second n-type layer has not been doped.

(4) An n-type Group III nitride semiconductor stacked layer structure according to (1) or (2) above, wherein the second n-type layer forms a layer that is homogeneously doped with n-type impurity atoms.

(5) An n-type Group III nitride semiconductor stacked layer structure according to (1) or (2) above, wherein the second n-type layer comprises a layer containing n-type impurity atoms at a high concentration and a layer containing n-type impurity atoms at a low concentration.

(6) An n-type Group III nitride semiconductor stacked layer structure according to (5) above, wherein the layers containing n-type impurity atoms at a high concentration and the layers containing n-type impurities at a low concentration alternately and periodically exist in the second n-type layer.

(7) An n-type Group III nitride semiconductor stacked layer structure according to (5) or (6) above, wherein the layer containing n-type impurity atoms at a high concentration in the second n-type layer has a concentration lower than that of the layer containing n-type impurity atoms at a high concentration in the first n-type layer.

(8) An n-type Group III nitride semiconductor stacked layer structure according to any one of (5) to (7) above, wherein the layer containing n-type impurity atoms at a low concentration in the second n-type layer has a concentration lower than that of the layer containing n-type impurity atoms at a low concentration in the first n-type layer.

(9) An n-type Group III nitride semiconductor stacked layer structure according to any one of (5) to (8) above, wherein a ratio (thd/tld) of the thickness (thd) of the layer containing n-type impurity atoms at a high concentration to the thickness (tld) of the layer containing n-type impurity atoms at a low concentration in the second n-type layer is smaller than that in the first n-type layer.

(10) An n-type Group III nitride semiconductor stacked layer structure according to any one of (5) to (9) above, wherein the thickness of the layer containing n-type impurity atoms at a high concentration in the second n-type layer is smaller than that in the first n-type layer.

(11) An n-type Group III nitride semiconductor stacked layer structure according to any one of (5) to (10) above, wherein the thickness of the layer containing n-type impurity atoms at a low concentration in the second n-type layer is greater than that in the first n-type layer.

(12) An n-type Group III nitride semiconductor stacked layer structure according to any one of (5) to (11) above, wherein the layer containing n-type impurity atoms at a high concentration and the layer containing n-type impurity atoms at a low concentration in the second n-type layer have thicknesses which are 0.5 to 500 nm.

(13) An n-type Group III nitride semiconductor stacked layer structure according to any one of (5) to (12) above, wherein, in the second n-type layer, the thickness of the layer containing n-type impurity atoms at a low concentration is equal to the thickness of the layer containing n-type impurity atoms at a high concentration or is greater than the thickness of the layer containing n-type impurity atoms at a high concentration.

(14) An n-type Group III nitride semiconductor stacked layer structure according to any one of (6) to (13) above, wherein, in the second n-type layer, the layer containing n-type impurity atoms at a high concentration and the layer containing n-type impurity atoms at a low concentration have a recurring periodic number of 2 to 20.

(15) An n-type Group III nitride semiconductor stacked layer structure according to any one of (5) to (14) above, wherein, in the second n-type layer, the layer containing n-type impurity atoms at a low concentration has not been intentionally doped with n-type impurity atoms.

(16) An n-type Group III nitride semiconductor stacked layer structure according to any one of (1) to (15) above, wherein the thickness of the second n-type layer is 0.01 to 0.5 µm.

(17) An n-type Group III nitride semiconductor stacked layer structure according to any one of (1) to (16) above, wherein an average concentration of n-type impurity atoms in the second n-type layer is not larger than ½ of an average concentration of n-type impurity atoms in the first n-type layer.

(18) An n-type Group III nitride semiconductor stacked layer structure according to any one of (1) to (17) above, wherein the n-type impurity atoms contained in the first n-type layer and/or the second n-type layer are any one kind of, or a combination of two or more kinds of, those selected from the group consisting of silicon (Si), germanium (Ge), sulfur (S), selenium (Se), tin (Sn) and tellurium (Te).

(19) An n-type Group III nitride semiconductor stacked layer structure according to (18) above, wherein the n-type impurity atoms are any one kind of, or a combination of two or more kinds of, those selected from the group consisting of silicon (Si), germanium (Ge) and tin (Sn).

(20) A Group III nitride semiconductor light-emitting device having a light-emitting layer comprising a Group III nitride semiconductor on a substrate, and having an n-type Group III nitride semiconductor stacked layer structure according to any one of (1) to (19) above between the substrate and the light-emitting layer.

(21) A lamp comprising a Group III nitride semiconductor light-emitting device according to (20) above.

(22) A lamp comprising a Group III nitride semiconductor light-emitting device according to (20) above and a fluorescent material.

(23) An electronic device incorporating a lamp according to (21) or (22) above.

(24) A machine incorporating an electronic device according to (23) above.

(25) A toy incorporating an electronic device according to (23) above.

In the n-type Group III nitride semiconductor stacked layer structure of the invention, the first n-type layer includes the layers of a low resistance containing n-type impurity atoms at a high concentration and the layers containing n-type impurity atoms at a low concentration, which are alternately stacked, and in which fine pits, dislocation ends and distortion appearing in the uppermost surface are buried with the second n-type layer, making it possible to obtain the n-type semiconductor layer having a low resistance and an excellent flatness. Therefore, a light-emitting device obtained by using the n-type Group III nitride semiconductor stacked layer structure has a low forward voltage, excellent light-emitting efficiency without permitting a drop in the reverse voltage that is caused by a leakage current, and features an excellent electrostatic breakdown voltage.

BEST MODES FOR CARRYING OUT THE INVENTION

Figure 1:
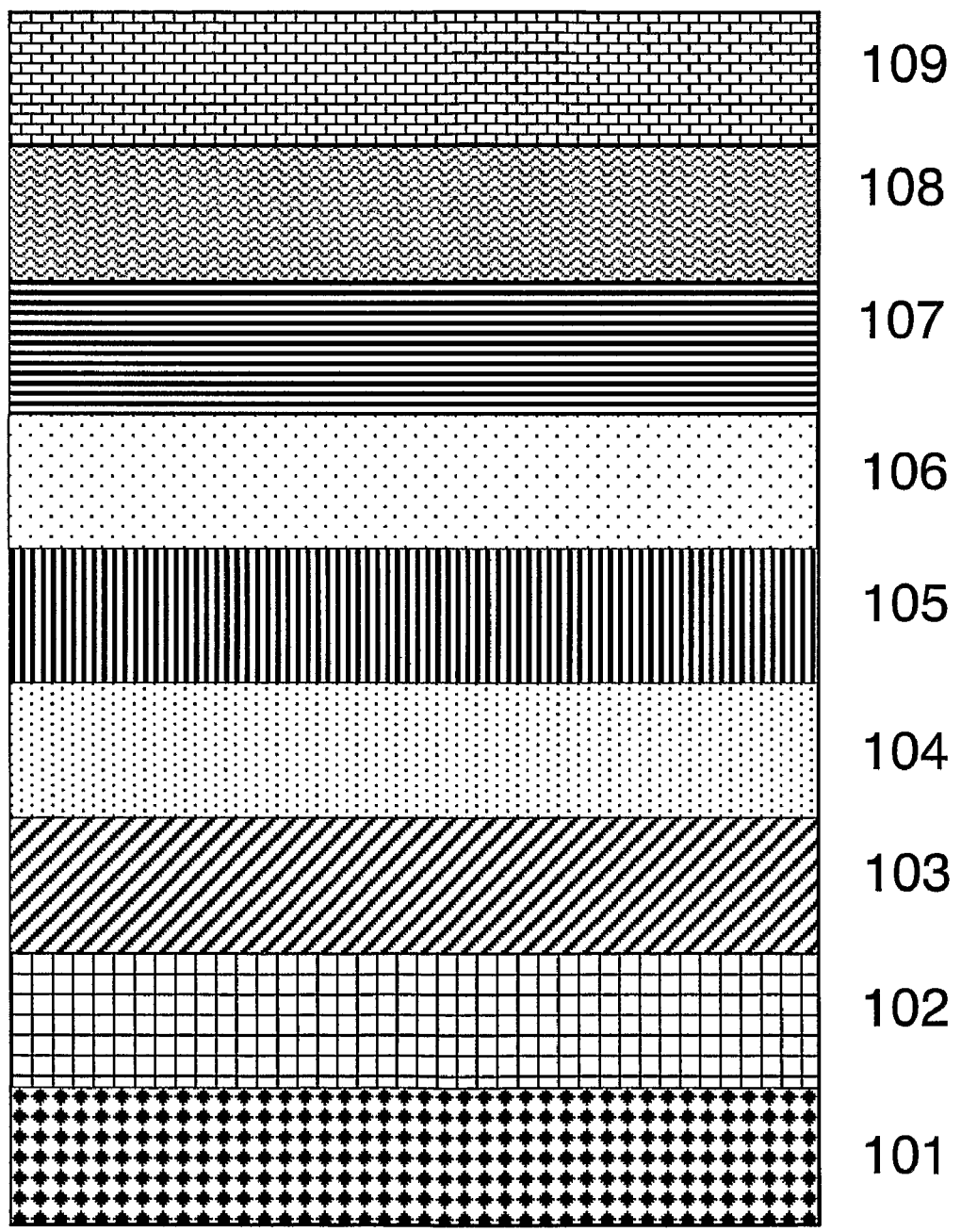
FIG. 1 is a diagram schematically illustrating the semiconductor stacked structure of a light-emitting device fabricated in Example 1 to 6.

In the present invention, the substrate on which an n-type Group III nitride semiconductor layer is stacked may have a comparatively high melting point (i.e., high heat resistance). Examples of the material of the substrate include oxide single crystal materials such as sapphire ($\alpha$-$Al_2O_3$ single crystal), zinc oxide (ZnO), and gallium lithium oxide ($LiGaO_2$), and Group IV semiconductor single crystals such as a silicon single crystal and cubic or hexagonal silicon carbide (SiC). Alternatively, a group III-V compound semiconductor single crystal material such as gallium phosphide (GaP) may also be employed as a substrate material. An optically transparent single-crystal material, through which light emitted from the light-emitting layer can be transmitted, is advantageously employed for a substrate material. Among them, sapphire is preferred.

The n-type Group III nitride semiconductor stacked layer structure of the present invention is formed from a Group III nitride semiconductor represented by a formula: $Al_XGa_YIn_ZN_{1-a}M_a$ ($0 \leq X \leq 1$, $0 \leq Y \leq 1$, $0 \leq Z \leq 1$, $X+Y+Z=1$, and $0 \leq a < 1$, wherein M represents a non-nitrogen Group V element). When the substrate is lattice-mismatched with the Group III nitride semiconductor layer formed thereon, the layer is preferably stacked with the mediation of a low-temperature buffer layer or a high-temperature buffer layer which mitigates mismatch and provides a Group III nitride semiconductor layer of high crystallinity. Such a buffer layer may be composed of aluminum gallium nitride ($Al_XGa_YIn_ZN$: $0 \leq X$, Y, $Z \leq 1$, $X+Y+Z=1$).

The Group III nitride semiconductor layer having the aforementioned composition may be formed through vapor phase growth means such as metal organic chemical vapor deposition (abbreviated as (MOCVD, MOVPE, or OMVPE)), molecular beam epitaxy (MBE), halogen vapor phase growth, or hydride vapor phase growth. Among these methods, MOCVD is preferably employed.

In MOCVD, hydrogen ($H_2$) or nitrogen ($N_2$) is employed as a carrier gas, trimethylgallium (TMG) or triethylgallium (TEG) is employed as a Ga source (Group III element source), trimethylaluminum (TMA) or triethylaluminum (TEA) is employed as an Al source (Group III element source), trimethylindium (TMI) or triethylindium (TEI) is employed as an In source (Group III element source), and ammonia ($NH_3$), hydrazine ($N_2H_4$), or the like is employed as a nitrogen source.

The n-type impurity atom used in the present invention is preferably one element or a combination of two or more elements selected from the group consisting of silicon (Si), germanium (Ge), sulfur (S), selenium (Se), tin (Sn), and tellurium (Te). Starting materials usable for n-type impurities include hydrides of the elements, for example, monosilane ($SiH_4$), disilane ($Si_2H_6$), germane ($GeH_4$), hydrogen sulfide ($H_2S$), hydrogen selenide ($H_2Se$), hydrogen telluride ($H_2Te$) and the like and organic compounds of these elements, for example, tetramethylsilicon (($CH_3)_4Si$), tetraethylsilicon (($C_2H_5)_4Si$), tetramethylgermanium (($CH_3)_4Ge$), tetraethylgermanium (($C_2H_5)_4Ge$), diethylselenium (($C_2H_5)_2Se$), diisopropylselenium (($C_3H_7)_2Se$), diethylsulfide (($C_2H_5)_2S$), diisopropylsulfide (($C_3H_7)_2S$), tetramethyltin (($CH_3)_4Sn$), tetraethyltin (($C_2H_5)_4Sn$), dimethyltellurium (($CH_3)_2Te$), diethyltellurium (($C_2H_5)_2Te$) and the like. In the MBE process, elemental germanium can also be utilized as a doping source.

When MOCVD is employed, preferably, a Group III nitride semiconductor layer of interest is grown from the aforementioned growth sources at 900° C. to 1,250° C. on a substrate.

A first n-type layer of the present invention has a structure which a layer containing n-type impurity atoms at a low concentration is stacked on a layer containing n-type impurity atoms at a high concentration. Therefore, the flatness of the uppermost surface of the first n-type layer is improved, because, cracks and pits which are generated on a surface of the layer containing n-type impurity atoms at a high concentration, which has a low resistance, are filled up with a portion of the layer containing n-type impurity atoms at a low concentration.

The n-type impurity atom higher concentration layer and the n-type impurity atom lower concentration layer are formed through modification of the amount of an n-type dopant source supplied to the vapor growth reaction system during growth of a Group III nitride semiconductor layer. In an exemplary procedure, a large amount of a n-type dopant source is instantly supplied to the vapor growth reaction system, thereby forming a n-type impurity atom higher concentration layer and subsequently, an undoped layer (i.e., a layer having a n-type impurity concentration of 0) is formed without feeding the Ge dopant source into the vapor growth reaction system. In an alternative procedure, after completion of the growth of an n-type impurity atom higher concentration layer, the growth is intermitted, and an n-type impurity atom lower concentration layer is grown under re-regulated growth conditions (e.g., V/III source ratio) suitable for forming a n-type impurity atom lower concentration layer.

Through modification of the amount of the n-type dopant source supplied to the vapor growth reaction system in a time-dependent manner, thin layers, each having a specific n-type impurity atom concentration, are alternatingly and periodically stacked. In the present invention, the first n-type layer, which includes a layer containing n-type impurity atoms at a high concentration and a layer containing n-type impurity atoms at a low concentration, preferably has a structure in which a large number of thin n-type impurity atom higher concentration layer and thin n-type impurity atom lower concentration layer are alternatingly and periodically stacked.

In the above structure, each thin n-type impurity atom higher concentration layer suitably has a thickness of 0.5 nm to 500 nm, preferably 2 nm to 200 nm, more preferably 3 nm to 50 nm. When the thickness is less than 0.5 nm, the amount of n-type dopant in the entire n-type Group III nitride semiconductor layer is insufficient, elevating resistance, whereas when the thickness is greater than 500 nm, cracks and pits generated in the higher concentration layer cannot completely be filled up with a portion of the lower concentration layer, resulting in poor flatness. When the thickness of the lower concentration layer is increased sufficiently for filling up cracks and pits, resistance of the entire n-type Group III nitride semiconductor layer also increases.

Similar to the thin n-type impurity atom higher concentration layer, each thin n-type impurity atom lower concentration layer preferably has a thickness of 0.5 nm to 500 nm, more preferably 2 nm to 200 nm, particularly preferably 3 nm to 50 nm. When the thickness is less than 0.5 nm, cracks and pits generated in the higher concentration layer cannot completely be filled up with a portion of the lower concentration layer, resulting in poor flatness, whereas when the thickness is greater than 500 nm, resistance of the entire n-type Group III nitride semiconductor layer increases, which is disadvantageous for producing a Group III nitride semiconductor light-emitting device exhibiting low forward voltage (Vf) or threshold voltage (Vth).

In a first n-type layer, a unit consisting of a higher concentration layer and a lower concentration layer which are in contact with each other is referred to as a repetition cycle. In a repetition cycle, the sum of the thickness of the higher concentration layer and that of the lower concentration layer; i.e., the thickness of a repetition cycle, is suitably 1 nm to 1,000 nm, preferably 4 nm to 400 nm, more preferably 6 nm to 100 nm. When the thickness is more than 1,000 nm, formation of cracks and pits cannot be prevented, or resistance of the n-type impurity concentration periodic variation layer increases. When the total thickness is less than 1 nm, the supply amount of n-type dopant source must be frequently modified, thereby lowering operation efficiency.

When the higher concentration layer is thicker than the lower concentration layer in a single repetition cycle, formation of cracks and pits cannot be prevented sufficiently and satisfactory flatness cannot be attained, whereas when the lower concentration layer has a thickness equal to or greater than that of the higher concentration layer in a single repetition cycle, high flatness can be attained. Therefore, the lower concentration layer preferably has a thickness not less than that of the higher concentration layer.

The entire first n-type layer preferably has a thickness of 0.1 μm to 10 μm, more preferably 0.3 μm to 7 μm, particularly preferably 0.5 μm to 5 μm. When the layer thickness is less than 0.1 μm, the produced light-emitting device exhibits high forward voltage, whereas when the thickness is more than 10 μm, an effect commensurate with the increase cannot be attained, thereby merely increasing cost.

In consideration of the thickness of a single repetition cycle and the thickness of the entire first n-type layer, the number of stacked repetition cycles is preferably 1 to 10,000, more preferably 10 to 1,000, particularly preferably 20 to 200. For example, a unit (repetition cycle) consisting of a higher concentration layer (thickness: 10 nm) and a lower concentration layer (thickness: 10 nm) is stacked 100 times, thereby forming a first n-type layer having a thickness of 2 μm.

The higher concentration layer preferably has an n-type impurity atom concentration of $5\times10^{17}$ cm$^{-3}$ to $5\times10^{19}$ cm$^{-3}$, more preferably $1\times10^{18}$ cm$^{-3}$ to $3\times10^{19}$ cm$^{-3}$, particularly preferably $3\times10^{18}$ cm$^{-3}$ to $2\times10^{19}$ cm$^{-3}$. When the concentration is lower than $5\times10^{17}$ cm$^{-3}$, resistance of the entire n-type semiconductor layer increases, and production of an LED exhibiting low forward voltage becomes difficult. When the n-type impurity atom concentration is more than $5\times10^{19}$ cm$^{-3}$, carrier concentration becomes about (3 to 4)$\times10^{19}$ cm$^{-3}$. When the n-type impurity atom is doped at a concentration more than this concentration, the density of cracks and pits on the surface steeply increases, which is not preferred. The n-type impurity atom concentration of the higher concentration layer is not necessarily uniform in the entire first n-type layer, and the concentration may vary cycle by cycle continuously or discretely. In addition, a single thin layer may have variation in n-type impurity atom concentration. Further, n-type impurity element is not necessarily one kind, and an n-type impurity element may be employed as a combination of two or more elements.

Preferably, the lower concentration layer has an n-type impurity atom concentration which is lower than that of the higher concentration layer and which is equal to or less than $2\times10^{19}$ cm$^{-3}$. When the n-type impurity atom concentration is in excess of $2\times10^{19}$ cm$^{-3}$, the density of cracks and pits on the surface steeply increases, which is not preferred. Thus, the n-type impurity atom concentration is more preferably $1\times10^{19}$ cm$^{-3}$ or less, particularly preferably $5\times10^{18}$ cm$^{-3}$ or less. Preferably, the lower limit of the concentration is as low as possible, and the lower concentration layer is not intentionally doped with n-type impurity atom. When the lower concentration layer is formed of an undoped Group III nitride semiconductor layer so as to further decrease the n-type impurity atom concentration, the effect of filling up cracks and pits generated on the surface of the higher concentration layer is further enhanced, which is preferred for producing an n-type semiconductor layer having a flat surface. Note that when the lower concentration layer has a lower n-type impurity atom concentration and a lower carrier concentration, the thickness of the lower concentration layer is preferably reduced.

Similar to the higher concentration layer, the n-type impurity atom concentration of the lower concentration layer is not necessarily uniform in the entire first n-type layer, and the concentration may vary cycle by cycle continuously or discretely. In addition, a single thin layer may have variation in n-type impurity atom concentration. Further, n-type impurity element is not necessarily one kind, and an n-type impurity element may be employed as a combination of two or more elements.

In the present invention, the second n-type layer containing n-type impurity atoms at a concentration lower than the average concentration of the first n-type layer as a whole is provided neighboring the layer containing n-type impurity atoms at a low concentration in the uppermost surface of the first n-type layer. Then, fine pits, dislocation ends and distortion appearing in the uppermost surface of the first n-type layer are buried with the second n-type layer contributing to further improving the flatness of the surface of the n-type Group III nitride semiconductor layer. The effect is particularly exhibited when the first n-type layer includes the layers containing n-type impurity atoms at a high concentration and the layers containing n-type impurity atoms at a low concentration, which are periodically and alternately stacked.

The effect, of when the pit density is further decreased in the surface, is exhibited to a conspicuous degree in both the reverse voltage and the electrostatic breakdown voltage when there is fabricated a structure having device functions such as of the active layer and the pn junction thereon.

The second n-type layer must be provided neighboring the lower concentration layer in the first n-type layer. The first n-type layer is formed in a stacked layer structure of a higher concentration layer and a lower concentration layer in order to fill up the pits formed in the higher concentration layer with a portion of the lower concentration layer. To obtain an uppermost surface having a low pit density, it is necessary that the final layer in the first n-type layer is a low concentration layer.

When the first n-type layer includes the higher concentration layers and the lower concentration layers that are alternately and periodically stacked, the final period may be terminated with the higher concentration layer, and the second n-type layer may be formed thereon. In this case, the final higher concentration layer in the first n-type layer can be regarded to be a portion of the second n-type layer.

It is desired that the second n-type layer has a thickness of 0.001 μm to 0.5 μm. When the thickness is smaller than this range, there is exhibited a decreased effect for burying small pits, dislocation ends and distortion appearing in the uppermost surface of the first n-type layer. When the thickness becomes greater than this range, on the other hand, the drive voltage increases. It is desired that the thickness is more preferably 0.005 μm to 0.2 μm and, most preferably, 0.01 μm to 0.15 μm to obtain a further increased effect.

It is desired that the concentration of n-type impurity atoms in the second n-type layer is not larger than ½ of the average concentration in the first n-type layer as a whole. More desirably, the concentration is not larger than 1/10 and, particularly, not larger than 1/50 to obtain the effect. The layer may not be doped as a matter of course. When the layer is not doped, the effect for flattening the uppermost surface can be most expected. From a relationship to the film thickness, however, attention must be given to an increase in the drive voltage.

The second n-type layer may be the one homogeneously doped with the n-type impurity atoms but is rather preferred to possess a structure obtained by periodically and alternately laminating higher concentration layers and lower concentration layers, as in the first n-type layer, from the standpoint of flattening the surface and lowering the resistance. The concentration of n-type impurity atoms in the second n-type layer referred to in this case stands for the average concentration of the n-type impurity atoms like in the first n-type layer.

To form the second n-type layer of a structure in which the layers containing n-type impurity atoms at a high concentration and the layers containing n-type impurity atoms at a low concentration are alternately and periodically stacked, the concentration of impurity atoms in the higher concentration layers may be decreased or the concentration of impurity atoms in the lower concentration layers may be decreased as compared to those of the first n-type layer. Or, both of them may be effected simultaneously. However, the structure in which the concentration of impurity atoms in the higher concentration layers is decreased, is excellent from the standpoint of controlling the average amount of doping, exhibits increased effect for flattening, and, hence, exhibits the most desired effect for flattening.

A ratio (thd/tld) of the thickness (thd) of the layer containing n-type impurity atoms at a high concentration to the thickness (tld) of the layer containing n-type impurity atoms at a low concentration in the second n-type layer may be smaller than that in the first n-type layer. The thickness of the higher concentration layer in the second n-type layer may be decreased, or the thickness of the lower concentration layer therein may be increased, as compared to the first n-type layer. Or both of them may be effected simultaneously. However, the structure of increasing the thickness of the lower concentration layer exhibits an increased effect for filling up the pits and, hence, exhibits the most favorable effect for flattening.

It is desired that the higher concentration layers and the lower concentration layers in the second n-type layer have thicknesses which are, respectively, not smaller than 0.5 nm but are not larger than 500 nm. When the thicknesses of the layers become greater than the above range, the resistivity becomes irregular in the vertical direction, and the layers can no longer be used for passing electric current. When the thicknesses are smaller than the above range, the effect for filling up the pits decreases. Further, desirably, the thicknesses are not smaller than 1 nm but are not larger than 100 nm and, particularly, in a range of not smaller than 5 nm but not larger than 50 nm to obtain favorable properties.

The higher concentration layer or the lower concentration layer may be thicker than the other. From the standpoint of the effect for filling up the pits, however, it is desired that the two have an equal thickness, or the lower concentration layer has a larger thickness.

The recurring periodic number of the higher concentration layers and the lower concentration layers is desirably 2 to 20 times in consideration of the thickness of the second n-type layer as a whole and the thicknesses of the higher concentration layers and of the lower concentration layers. More desirably, the number is not larger than 15 times and, most desirably, is not larger than 10 times. If the periodic number increases, the number of times of changing over a valve greatly increases in growing the semiconductor exerting an increased load on the apparatus for production.

The concentration of n-type impurity atoms in the higher concentration layer in the second n-type layer is desirably not smaller than $1 \times 10^{16}$ cm$^{-3}$ but is not larger than $2.5 \times 10^{19}$ cm$^{-3}$, more desirably, not smaller than $1 \times 10^{17}$ cm$^{-3}$ but is not larger than $5 \times 10^{18}$ cm$^{-3}$, and particularly desirably, not smaller than $2 \times 10^{17}$ cm$^{-3}$ but is not larger than $2.5 \times 10^{18}$ cm$^{-3}$. When the concentration is not larger than $1 \times 10^{16}$ cm$^{-3}$, the stacked layer structure of the second n-type layer exhibits a small effect for lowering the resistance. When the concentration is not smaller than $2.5 \times 10^{19}$ cm$^{-3}$, on the other hand, the effect for flattening the surface decreases. As in the first n-type layer, the concentration of n-type impurity atoms in the higher concentration layer need not necessarily remain constant in the whole second n-type layer but may be varied continuously or discretely for every period. Further, the concentration of n-type impurity atoms may be varied in every thin layer. The n-type impurity element need not be of one kind but may be a combination of elements of two or more kinds.

It is desired that the concentration of n-type impurity atoms in the lower concentration layer in the second n-type layer is lower than the concentration of n-type impurity atoms in the higher concentration layer, and is not higher than $1 \times 10^{19}$ cm$^{-3}$. When the concentration of n-type impurity atoms exceeds $1 \times 10^{19}$ cm$^{-3}$, the effect for flattening the surface decreases. More preferably, the concentration is not larger than $2 \times 10^{18}$ cm$^{-3}$ and, particularly preferably, not larger than $1 \times 10^{18}$ cm$^{-3}$. As for the lower limit, the lower the better, and it is desired that the layer is not dared doped. If the lower concentration layer is constituted by using the thin undoped Group III nitride semiconductor layer in order to further decrease the concentration of the n-type impurity atoms, the effect is further enhanced for filling up cracks and pits generated in the surface of the higher concentration layer, which is desirable for obtaining the n-type semiconductor layer having a flat surface. It is desired to decrease the thickness of the lower concentration layer when the lower concentration layer contains n-type impurity atoms at a lower concentration and carriers at a lower concentration.

In the lower concentration layer, too, as in the higher concentration layer, the concentration of n-type impurity atoms in the lower concentration layer need not necessarily remain constant in the whole second n-type layer but may be varied continuously or discretely for every period. Further, the concentration of n-type impurity atoms may be varied in every thin layer. The n-type impurity element needs not be of one kind but may be a combination of elements of two or more kinds.

The n-type impurity atoms with which the first n-type layer and/or the second n-type layer are doped can be those of one kind or two or more kinds selected from the group consisting of silicon (Si), germanium (Ge), sulfur (S), selenium (Se), tin (Sn) and tellurium (Te). Among them, Si, Ge, S and Sn are desired since they can be used as good n-type dopants.

The n-type impurity atoms with which the first n-type layer and the second n-type layer are doped may be the same or different. The structure may be such that the first n-type layer is doped with Ge and the second n-type layer is doped with Si.

The n-type impurity atom concentration may be determined through, for example, secondary ion mass spectrometry (SIMS), which is a technique including irradiating a surface of a sample with a primary ion beam and analyzing the released ionized elements through mass analysis. The technique enables quantification of a specific element and observation of a concentration distribution profile of the element in the depth direction. The n-type impurity atom present in the Group III nitride semiconductor layer is effectively quantified through the technique. In the analysis, the thickness of each layer can be also calculated.

When the Group III nitride semiconductor light-emitting device is to be fabricated by utilizing the n-type Group III nitride semiconductor stacked layer structure, the stacked layer structure can be arranged anywhere between the substrate and the light-emitting layer. For instance, it can be provided being directly joined to the surface of the substrate, or can be provided being joined to a buffer layer provided on the surface of the substrate. Or, it can be provided being joined onto the base layer made of undoped GaN or the like. In this case, the stacked layer structure is so arranged that the first n-type layer is on the side of the substrate, the first n-type layer is stacked and, then, the second n-type layer is stacked to efficiently fill up fine pits occurring in the surface of the first n-type layer.

Through provision of a Group III nitride semiconductor layer on the n-type semiconductor stacked layer structure of the present invention, which is closed to the substrate or a layer such as a buffer layer, the provided Group III nitride semiconductor layer exhibits excellent crystallinity. This is because propagation of misfit dislocations and other dislocations induced by lattice mismatch with the substrate to an upper layer can be prevented through provision of the n-type semiconductor stacked layer structure of the present invention.

When the n-type semiconductor stacked layer structure of the present invention has been provided, propagation of dislocations penetrating through a layer under the semiconductor stacked layer structure of the present invention can be prevented. Therefore, the light-emitting layer formed on the n-type semiconductor stacked layer structure of the present invention exhibits excellent crystallinity, whereby a Group III nitride semiconductor light-emitting device exhibiting high emission efficiency can be produced.

The inventive n-type Group III nitride semiconductor stacked layer structure which is highly flattened and has a low resistance, can be utilized as an n-contact layer for forming an negative electrode of the light-emitting device. The obtained light-emitting device exhibits such effects as suppressing the leakage of current and increasing the electrostatic breakdown voltage.

When used as the n-contact layer of the light-emitting device structure, in particular, the effect is distinctly exhibited when the light-emitting layer has a quantum well structure. The quantum well structure is a lamination of thin films, and the leakage tends to occur if the base layers have poor flatness. By utilizing the n-type Group III nitride semiconductor stacked layer structure of the present invention, therefore, it is made possible to improve the characteristics.

No particular limitation is imposed on the light-emitting layer, and any known light-emitting layer may be employed. Examples of the light-emitting layer composed of a Group III nitride semiconductor include those having a single quantum well structure or a multiple quantum well structure, having a composition represented by $Al_XGa_YIn_ZN_{1-a}M_a$ ($0 \leq X \leq 1$, $0 \leq Y \leq 1$, $0 \leq Z \leq 1$, $X+Y+Z=1$, and $0 \leq a < 1$, wherein M represents a non-nitrogen Group V element). No particular limitation is imposed on the p-type Group III nitride semiconductor for forming a light-emitting member having a double-hetero junction structure, and any of a variety of known semiconductors doped with a p-type dopant (e.g., Mg or Zn) and represented by the aforementioned formula may be employed.

After completion of stacking of semiconductor layers of interest, a positive electrode and a negative electrode are formed at predetermined positions. No particular limitation is imposed on the positive and negative electrodes for use in compound semiconductor light-emitting devices, and any known positive or negative electrode having a variety of compositions and structures may be employed in the present invention. No particular limitation is imposed on the method for producing the electrodes, and any known method such as vacuum vapor deposition or sputtering may be employed.

The n-type Group III nitride semiconductor stacked layer structure of the present invention can be used for the production of light-emitting diodes, laser diodes and electronic devices. It is further possible to produce the Group III nitride semiconductor light-emitting device by using the n-type Group III nitride semiconductor stacked layer structure of the present invention, and by providing the light-emitting device with a transparent cover relying, for example, upon widely known means to fabricate a lamp. It is, further, possible to produce a white lamp or a chip by combining the Group III nitride semiconductor light-emitting device with a cover having a fluorescent material and a resin molding.

Use of the stacked layer structure of the present invention makes it possible to obtain the Group III nitride semiconductor light-emitting device having excellent electrostatic breakdown voltage and good characteristics, which ages little. Namely, the invention makes it possible to produce an LED lamp having excellent electrostatic breakdown voltage and which ages well. Therefore, the electronic devices such as cell phones, displays and panels incorporating the LED lamp of the invention, as well as automobiles, machines such as computers and toys such as game machines incorporating the electronic device, feature high reliability against various deteriorating factors such as static electricity and aging, and maintain good characteristics.

EXAMPLES

The invention will be described in further detail with reference to Examples to which, however, the invention is in no way limited.

Example 1

A light-emitting device was fabricated by using the n-type Group III nitride semiconductor stacked layer structure of the present invention. FIG. 1 is a diagram schematically illustrating the semiconductor stacked structure of a light-emitting device fabricated in this Example. Reference numeral 101 denotes a substrate made of sapphire, 102 denotes a high temperature buffer layer of AlN, and 103 denotes an base layer of undoped GaN. Reference numeral 104 denotes a first n-type layer of Ge-doped GaN, which works as an n-contact layer in the light-emitting device. Reference numeral 105 denotes a second n-type layer of Ge-doped GaN, and 104 and 105 constitute the n-type Group III nitride semiconductor stacked layer structure of the present invention. Reference numeral 106 denotes an n-clad layer of Si-doped InGaN, 107 denotes a light-emitting layer of a multiple quantum well structure, 108 denotes a p-clad layer of Mg-doped AlGaN, and 109 denotes a p-contact layer of Mg-doped AlGaN.

An above-mentioned stacked structure including a sapphire substrate and Group III nitride semiconductor layers successively stacked on the substrate was formed by means of conventional reduced-pressure MOCVD through the following procedure. Firstly, a (0001)-sapphire substrate 101 was placed on a high-purity graphite (for semiconductor) susceptor to be heated at a film formation temperature by a high-frequency (RF) induction heater. The sapphire substrate placed on the susceptor was placed in a stainless steel-made vapor growth reactor furnace, and the reactor furnace was purged with nitrogen.

After passage of nitrogen in the vapor growth reactor furnace for 8 minutes, the substrate 101 was heated over 10 minutes from room temperature to 600° C. by means of the induction heater. While the substrate 101 was maintained at 600° C., hydrogen gas and nitrogen gas were caused to flow in the vapor growth reactor furnace so as to adjust the pressure inside the furnace to $1.5 \times 10^4$ Pa. The surface of the substrate 101 was thermally cleaned by allowing the substrate to stand for 2 minutes under these temperature/pressure conditions. After completion of thermal cleaning, the supply of nitrogen gas was stopped, but hydrogen was continuously supplied to the reactor furnace.

Subsequently, the substrate 101 was heated to 1,120° C. under hydrogen. After confirmation that a constant temperature of 1,120° C. was attained, hydrogen gas containing trimethylaluminum (TMA) vapor was supplied to the vapor growth reactor furnace for a predetermined period of time. Through this step, the supplied TMA was caused to react with N atoms which had been released through decomposition of nitrogen-containing deposits on an inner wall of the reactor furnace, thereby depositing a high-temperature buffer layer 102 composed of aluminum nitride (AlN) thin film having a thickness of some nm on the sapphire substrate 101. Supply of hydrogen gas containing TMA vapor into the vapor growth reactor furnace was stopped, thereby completing growth of AlN. The conditions were maintained for some time, whereby the TMA vapor remaining in the furnace was completely removed.

Subsequently, ammonia ($NH_3$) gas was supplied to the vapor growth reactor furnace. After a predetermined period of time from the start of supply of ammonia gas, the susceptor temperature was lowered to 1,040° C. under ammonia flow. After confirmation that the susceptor temperature was lowered to 1,040° C. and the susceptor maintained a constant temperature of 1,040° C., supply of trimethylgallium (TMG) into the vapor growth reactor furnace was started, and a base layer 103 composed of undoped GaN was grown for a predetermined period of time. The thickness of the base layer 103 was adjusted to 8 μm.

Subsequently, the substrate 1 was heated to 1,120° C. After confirmation that a constant temperature of 1,120° C. was attained, tetramethylgermanium (($CH_3$)$_4$Ge) was supplied for a predetermined period of time, followed by stopping supply for the same period of time. The cycle was repeated 100 times, to thereby form a Ge-doped first n-type layer 104 having a thickness of 2.0 μm which was composed of the high-Ge-concentration layers and low-Ge-concentration layers and in which Ge concentration periodically varied layer-by-layer.

Subsequently, the growth was once interrupted by discontinuing the flow of the trimethyl gallium and tetramethyl germanium while maintaining the substrate temperature unchanged to adjust the flow rate of the tetramethyl germanium to be 1/50 during this period. When the flow rate was stabilized, the flow of the trimethyl gallium and tetramethyl germanium was resumed and was continued for a predetermined period of time. Thereafter, the flow of the tetramethyl germanium was discontinued for the same period of time.

This cycle was repeated 10 times to form the second n-type layer 105 comprising the Ge-doped GaN having a thickness of 0.2 μm.

After the growth of the Ge-doped second n-type layer 105 has been finished, an n-clad layer 106 comprising Si-doped n-type $In_{0.03}Ga_{0.97}N$ was stacked at 720° C. The n-clad layer 106 was grown maintaining a thickness of 18 nm by using the triethyl gallium (TEG) as a gallium source and trimethyl indium (TMI) as an indium source. The doping with Si was about $1 \times 10^{18}$ cm$^{-3}$.

Next, on the n-clad layer 106, there was provided a light-emitting layer 107 of a multiple quantum well structure which was a 5-periodic structure including barrier layers of GaN and well layers of $In_{0.25}Ga_{0.75}N$ while maintaining the temperature of the substrate 101 at 720° C. In the light-emitting layer 107 of the multiple quantum well structure, first, the GaN barrier layer was provided being joined to the n-clad layer 106, and the $In_{0.25}Ga_{0.75}N$ well layer was provided thereon. This was repeated five times and, thereafter, a sixth GaN barrier layer was formed on the fifth well layer to obtain the light-emitting layer 107 of the multiple quantum well structure which was the 5-periodic structure.

The GaN barrier layer was grown using the triethyl gallium (TEG) as a gallium source. The layer possessed a thickness of 16 nm and was doped with Si. The doping with Si was about $1 \times 10^{17}$/cm$^{-3}$. The $In_{0.25}Ga_{0.75}N$ well layer was grown using the triethyl gallium (TEG) as a gallium source and the trimethyl indium (TMI) as an indium source. The layer possessed a thickness of 2.5 nm but was not doped.

On the light-emitting layer 107 of the multiple quantum well structure, there was formed a p-clad layer 108 of $Al_{0.07}Ga_{0.93}N$ doped with magnesium (Mg). A bis-cyclopentadienyl Mg was used as a source for doping with Mg. The layer thickness was 10 nm. On the p-clad layer 108, there was further formed a p-contact layer 109 of $Al_{0.02}Ga_{0.98}N$ doped with Mg. Mg was so added that the concentration of positive holes in the p-contact layer 109 was $8 \times 10^{17}$ cm$^{-3}$.

After the growth of the p-contact layer 109 has been finished, supply of electric power to the induction heater was discontinued, and the substrate 101 was permitted to naturally cool down to room temperature. While the temperature was lowering, the atmosphere in the vapor growth reactor furnace was constituted by nitrogen only. After having confirmed that the temperature of the substrate 101 has dropped down to room temperature, the stacked structure was taken out from the vapor growth reactor furnace. At this moment, the above p-type $Al_{0.02}Ga_{0.98}N$ contact layer 109 already exhibited p-type conductivity even without effecting the annealing for electrically activating the p-type carrier (Mg).

Figure 2:
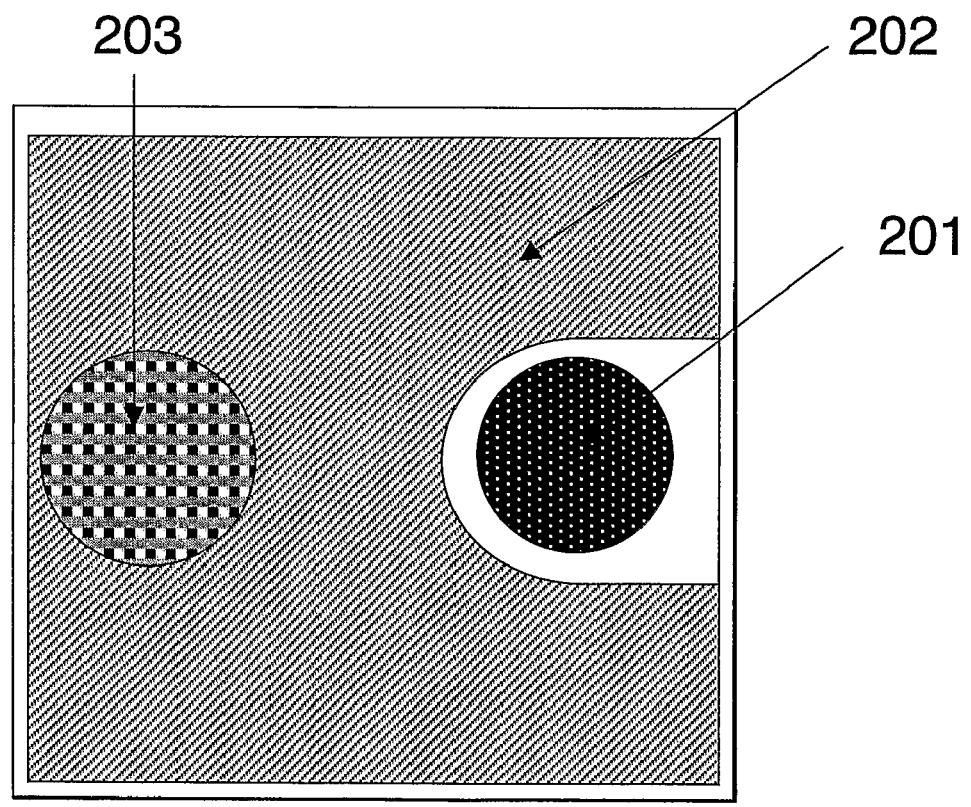
FIG. 2 is a diagram schematically illustrating the plane shapes of the electrodes of a light-emitting device fabricated in Example 1 to 6.

Next, by utilizing the known photolithography technology and dry-etching technology, a layer containing Ge atoms at a high concentration in the first n-type layer 104 was exposed on only a region on where an n-type ohmic electrode 201 was to be formed. On the exposed surface of the layer containing Ge atoms at a high concentration, there was formed the n-type ohmic layer 201 laminating titanium and gold thereon (titanium was on the semiconductor side). By utilizing a general vacuum evaporation means and a known photolithography means, on the whole surface of the remaining p-contact layer 109 of the stacked structure, there was formed the p-type ohmic electrode 202 by successively laminating platinum and gold from the semiconductor side. Thereafter, a p-type bonding pad 203 comprising Au/Ti/Al/Ti/Au was formed on a portion of the p-type ohmic electrode 202. FIG. 2 illustrates the plane shapes of the electrodes.

Thereafter, the stacked structure was cut into LED chips of a square shape (350 μm×350 μm), and each chip was placed on a lead frame which was bonded to a gold wire for allowing device operation current to flow from the lead frame to the LED chip.

Upon passage of forward device operation current between the n-type and the p-type Ohmic electrodes 201 and 202 via the lead frame, the chip exhibited forward voltage of 3.2 V at a forward current of 20 mA. The emission center wavelength of the band of blue light emission at a forward current of 20 mA was found to be 460 nm. The emission intensity of the light emitted from the chip, as determined through a typical integrating sphere, was 5 mW. Thus, a Group III nitride semiconductor light-emitting device attaining a high emission intensity was successfully fabricated.

A voltage was measured to be not lower than 20 V at a moment when it was attempted to pass a current of 10 μA in the reverse direction. After having conducted the electrostatic breakdown voltage testing, eight points among ten points were not broken despite of giving an electrostatic shock of 500 V on a machine model.

The first n-type layer 104 and the second n-type layer 105 of the obtained stacked structure were subjected to the SIMS analysis. As a result, in the first n-type layer 104, the higher concentration layer contained Ge atoms at a concentration of $1.2 \times 10^{19}$ cm$^{-3}$ and possessed a thickness of 10 nm. The lower concentration layer contained Ge atoms at a concentration of $1 \times 10^{18}$ cm$^{-3}$ and possessed a thickness of 10 nm. In the second n-type layer 105, the higher concentration layer contained Ge atoms at a concentration of $2.4 \times 10^{17}$ cm$^{-3}$ and possessed a thickness of 10 nm. The lower concentration layer contained Ge atoms at a concentration that was lower than a detectable lower limit which, therefore, could not be determined, and possessed a thickness of 10 nm. Therefore, the first n-type layer 104 contained Ge atoms at an average concentration of $6.5 \times 10^{18}$ cm$^{-3}$ and the second n-type layer 105 contained Ge atoms at an average concentration of $1.2 \times 10^{17}$ cm$^{-3}$.

The surface of the second n-type layer 105 was very flat and had a pit density of not larger than 20 pits/cm$^2$.

The conditions for the SIMS measurement consisted of using Cs$^+$ as the primary ion species, applying an acceleration voltage of 14.5 keV and flowing an ionic current of 40 nA. The raster region was 100 μm$^2$ and the analyzing region was 30 μm$^2$.

Comparative Example 1

A Group III nitride semiconductor light-emitting device was fabricated in the same manner as in Example 1 with the exception of forming the first n-type layer 104 by flowing the tetramethyl germanium at all times, doping the layer with Ge homogeneously, and not forming the second n-type layer 105.

The obtained light-emitting device was evaluated in the same manner as in Example 1. The forward voltage was as high as 3.5 V and the intensity of light was as low as 3.5 mW. Further, the voltage for flowing the reverse current of 10 μA was 5V, and the number of leaky chips were about one-half. Chips having good reverse voltages were put to the electrostatic breakdown voltage testing to find that all of 10 chips were destroyed by an electrostatic shock of 50 V.

After the first n-type layer 104 was formed, the surface thereof was observed to find that the pit density in the surface was as very high as 10$^6$ pits/cm$^2$ or more, and the surface was not flat.

Example 2

In this Example, a Group III nitride semiconductor light-emitting device was fabricated in the same manner as in Example 1 with the exception of setting the concentrations of impurity atoms in the higher concentration layer and in the lower concentration layer in the second n-type layer 105 to be the same as the concentration of impurity atoms in the first n-type layer 104, decreasing the thickness of the higher concentration layer to be 3 nm, increasing the thickness of the lower concentration layer to be 30 nm, and setting the recurring periodic number of the higher concentration layers and of the lower concentration layers to be 5 times. Therefore, the first n-type layer 104 contained Ge atoms at an average concentration of $6.5 \times 10^{18}$ cm$^{-3}$ which was the same as that of Example 1, and the second n-type layer 105 contained Ge atoms at an average concentration of $2 \times 10^{18}$ cm$^{-3}$.

The obtained light-emitting device was evaluated in the same manner as in Example 1. The chip exhibited forward voltage of 3.3 V at a forward current of 20 mA. The emission center wavelength of the band of blue light emission at a forward current of 20 mA was found to be 455 nm. The emission intensity of the light emitted from the chip, as determined through a typical integrating sphere, was 4.8 mW. Thus, a Group III nitride semiconductor light-emitting device attaining high emission intensity was successfully fabricated.

A voltage was measured to be not lower than 20 V at a moment when it was attempted to pass a current of 10 μA in the reverse direction. After having conducted the electrostatic breakdown voltage testing, seven points among ten points were not broken despite of giving an electrostatic shock of 200 V on a machine model.

After the second n-type layer 105 was formed, the surface thereof was observed to find that the pit density in the surface was as low as 20 pits/cm$^2$ or less, and the surface was very flat.

Example 3

In this Example, a Group III nitride semiconductor light-emitting device was fabricated in the same manner as in Example 1 with the exception of forming the second n-type layer 105 by using a layer homogeneously doped with Ge at a low concentration. In the second n-type layer 105, the amount of doping with Ge was set to be ¹⁄₂₅ that of the higher concentration layer in the first n-type layer 104 and the thickness was set to be 0.04 μm. That is, the second n-type layer 105 contained Ge atoms at a concentration of $4.8 \times 10^{17}$ cm$^{-3}$.

The obtained light-emitting device was evaluated in the same manner as in Example 1. The chip exhibited forward voltage of 3.2 V at a forward current of 20 mA. The emission center wavelength of the band of blue light emission at a forward current of 20 mA was found to be 465 nm. The emission intensity of the light emitted from the chip, as determined through a typical integrating sphere, was 5.2 mW. Thus, a Group III nitride semiconductor light-emitting device attaining high emission intensity was successfully fabricated.

A voltage was measured to be not lower than 20 V at a moment when it was attempted to pass a current of 10 μA in the reverse direction. After having conducted the electrostatic breakdown voltage testing, nine points among ten points were not broken despite of giving an electrostatic shock of 500V on a machine model.

After the second n-type layer 105 was formed, the surface thereof was observed to find that the pit density in the surface was as low as 20 pits/cm$^2$ or less, and the surface was very flat.

Example 4

In this Example, a Group III nitride semiconductor light-emitting device was fabricated in the same manner as in Example 1 with the exception of forming the first and second n-type layers 104 and 105 by using the diethyl sulfide (($C_2H_5)_2S$) instead of using the tetramethyl germanium (($CH_3)_4Ge$).

The obtained light-emitting device was evaluated in the same manner as in Example 1. The chip exhibited forward voltage of 3.1 V at a forward current of 20 mA. The emission center wavelength of the band of blue light emission at a forward current of 20 mA was found to be 470 nm. The emission intensity of the light emitted from the chip, as determined through a typical integrating sphere, was 4.6 mW. Thus, a Group III nitride semiconductor light-emitting device attaining high emission intensity was successfully fabricated.

A voltage was measured to be not lower than 20 V at a moment when it was attempted to pass a current of 10 μA in the reverse direction. After having conducted the electrostatic breakdown voltage testing, seven points among ten points were not broken despite of giving an electrostatic shock of 500 V on a machine model.

After the second n-type layer 105 was formed, the surface thereof was observed to find that the pit density in the surface was as low as 20 pits/cm$^2$ or less, and the surface was very flat.

Example 5

In this Example, a Group III nitride semiconductor light-emitting device was fabricated in the same manner as in Example 1 with the exception of forming the first and second n-type layers 104 and 105 by using the tetramethyl tin (($CH_3)_4Sn$) instead of using the tetramethyl germanium (($CH_3)_4Ge$).

The obtained light-emitting device was evaluated in the same manner as in Example 1. The chip exhibited a forward voltage of 3.1 V at a forward current of 20 mA. The emission center wavelength of the band of blue light emission at a forward current of 20 mA was found to be 458 nm. The emission intensity of the light emitted from the chip, as determined through a typical integrating sphere, was 4.7 mW.

A voltage was measured to be not lower than 20 V at a moment when it was attempted to pass a current of 10 μA in the reverse direction. After having conducted the electrostatic breakdown voltage testing, seven points among ten points were not broken despite giving an electrostatic shock of 500 V on a machine model.

After the second n-type layer 105 was formed, the surface thereof was observed to find that the pit density in the surface was as low as 20 pits/cm$^2$ or less, and the surface was very flat.

Example 6

In this Example, a Group III nitride semiconductor light-emitting device was fabricated in the same manner as in Example 1 with the exception of forming the first and second n-type layers 104 and 105 by using the monosilane ($SiH_4$) instead of using the tetramethyl germanium (($CH_3)_4Ge$).

The obtained light-emitting device was evaluated in the same manner as in Example 1. The chip exhibited forward voltage of 2.9 V at a forward current of 20 in A. The emission center wavelength of the band of blue light emission at a forward current of 20 mA was found to be 455 nm. The emission intensity of the light emitted from the chip, as determined through a typical integrating sphere, was 5.2 mW.

A voltage was measured to be not lower than 20 V at a moment when it was attempted to pass a current of 10 μA in the reverse direction. After having conducted the electrostatic breakdown voltage testing, ten points among ten points were not broken despite giving an electrostatic shock of 500 V on a machine model.

After the second n-type layer 105 was formed, the surface thereof was observed to find that the pit density in the surface was as low as 20 pits/cm$^2$ or less, and the surface was very flat.

Example 7

Figure 3:
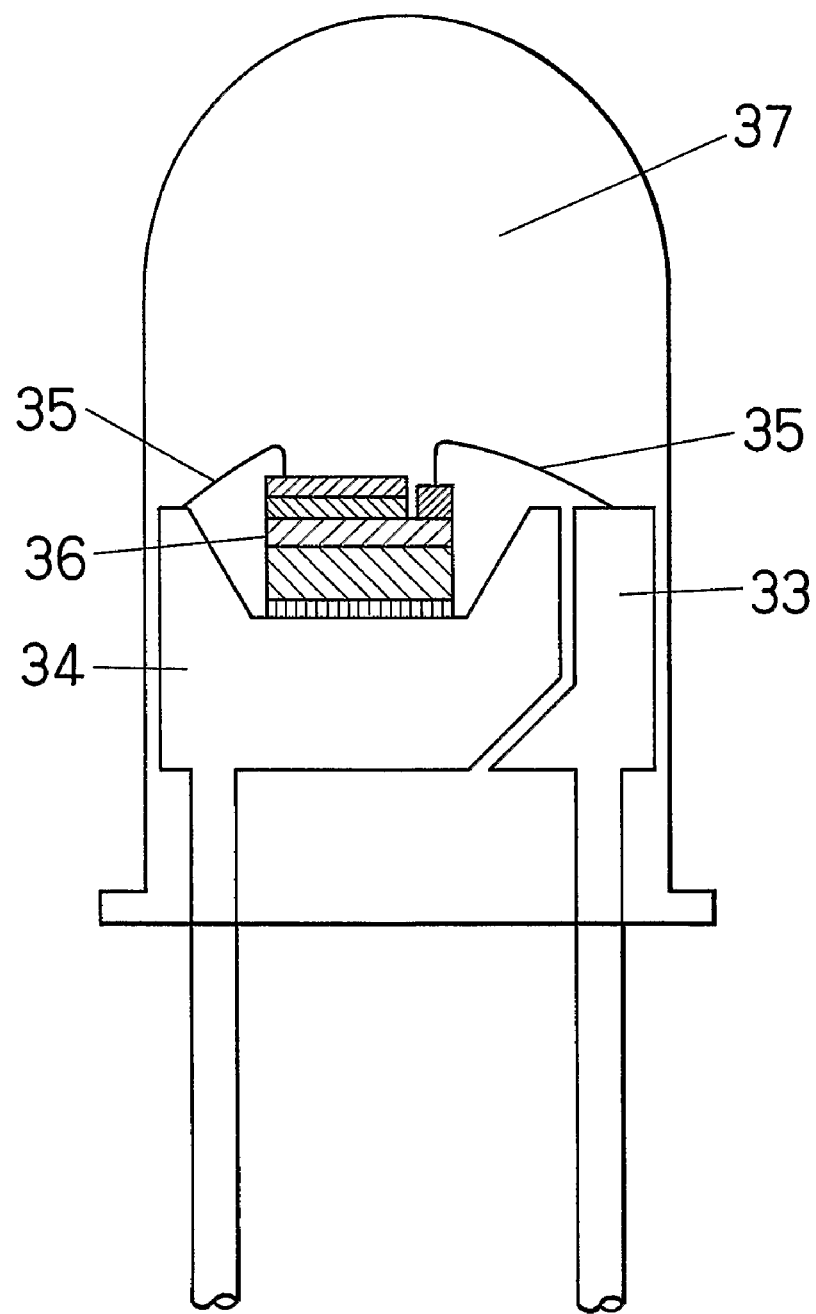
FIG. 3 is schematic cross-section of a lamp fabricated in Example 7.

In this Example, an LED lamp shown in FIG. 3 was fabricated according to the following procedure by using the Group III nitride semiconductor light-emitting device (LED chip) fabricated in Example 1.

First, an LED chip 36 was placed on a second lead frame 34 with the side of the sapphire substrate facing downward and was adhered thereto with an adhesive. The n-type ohmic electrode was connected to a first lead frame 33, and the bonding pad was connected to a second lead frame 34 by using Au wires 35, so that an device drive current could be fed to the LED chip 36. The entire body was molded with a transparent epoxy resin 37 into the shape of an LED lamp.

INDUSTRIAL APPLICABILITY

The n-type Group III nitride semiconductor stacked layer structure produced in the present invention exhibits excellent surface flatness and low resistance. Therefore, the semiconductor stacked layer structure is useful for a Group III nitride semiconductor light-emitting device.

The invention claimed is:

1. An n-type Group III nitride semiconductor stacked layer structure comprising a first n-type layer which includes layers containing n-type impurity atoms at a high concentration and layers containing n-type impurity atoms at a low concentration, and a second n-type layer containing n-type impurity atoms at an average concentration smaller than that of the first n-type layer, wherein the layers containing n-type impurity atoms at a high concentration and the layers containing n-type impurities at a low concentration alternately and periodically exist in the first n-type layer and the second n-type layer neighbors the layer containing n-type impurity atoms at a low concentration in the first n-type layer.

2. An n-type Group III nitride semiconductor stacked layer structure according to claim 1, wherein the second n-type layer has not been doped.

3. An n-type Group III nitride semiconductor stacked layer structure according to claim 1, wherein the second n-type layer forms a layer that is homogeneously doped with n-type impurity atoms.

4. An n-type Group III nitride semiconductor stacked layer structure according to claim 1, wherein the second n-type layer comprises a layer containing n-type impurity atoms at a high concentration and a layer containing n-type impurity atoms at a low concentration.

5. An n-type Group III nitride semiconductor stacked layer structure according to claim 4, wherein the layers containing n-type impurity atoms at a high concentration and the layers containing n-type impurities at a low concentration alternately and periodically exist in the second n-type layer.

6. An n-type Group III nitride semiconductor stacked layer structure according to claim 4, wherein the layer containing n-type impurity atoms at a high concentration in the second n-type layer has a concentration lower than that of the layer containing n-type impurity atoms at a high concentration in the first n-type layer.

7. An n-type Group III nitride semiconductor stacked layer structure according to claim 4, wherein the layer containing n-type impurity atoms at a low concentration in the second n-type layer has a concentration lower than that of the layer containing n-type impurity atoms at a low concentration in the first n-type layer.

8. An n-type Group III nitride semiconductor stacked layer structure according to claim 4, wherein a ratio (thd/tld) of the thickness (thd) of the layer containing n-type impurity atoms at a high concentration to the thickness (tld) of the layer containing n-type impurity atoms at a low concentration in the second n-type layer is smaller than that in the first n-type layer.

9. An n-type Group III nitride semiconductor stacked layer structure according to claim 4, wherein the thickness of the layer containing n-type impurity atoms at a high concentration in the second n-type layer is smaller than that in the first n-type layer.

10. An n-type Group III nitride semiconductor stacked layer structure according to claim 4, wherein the thickness of the layer containing n-type impurity atoms at a low concentration in the second n-type layer is greater than that in the first n-type layer.

11. An n-type Group III nitride semiconductor stacked layer structure according to claim 4, wherein the layer containing n-type impurity atoms at a high concentration and the layer containing n-type impurity atoms at a low concentration in the second n-type layer have thicknesses which are 0.5 to 500 nm.

12. An n-type Group III nitride semiconductor stacked layer structure according to claim 4, wherein, in the second n-type layer, the thickness of the layer containing n-type impurity atoms at a low concentration is equal to the thickness of the layer containing n-type impurity atoms at a high concentration or is greater than the thickness of the layer containing n-type impurity atoms at a high concentration.

13. An n-type Group III nitride semiconductor stacked layer structure according to claim 5, wherein, in the second n-type layer, the layer containing n-type impurity atoms at a high concentration and the layer containing n-type impurity atoms at a low concentration have a recurring periodic number of 2 to 20.

14. An n-type Group III nitride semiconductor stacked layer structure according to claim 4, wherein, in the second n-type layer, the layer containing n-type impurity atoms at a low concentration has not been intentionally doped with n-type impurity atoms.

15. An n-type Group III nitride semiconductor stacked layer structure according to claim 1, wherein the thickness of the second n-type layer is 0.01 to 0.5 µm.

16. An n-type Group III nitride semiconductor stacked layer structure according to claim 1, wherein an average concentration of n-type impurity atoms in the second n-type layer is not larger than ½ of an average concentration of n-type impurity atoms in the first n-type layer.

17. An n-type Group III nitride semiconductor stacked layer structure according to claim 1, wherein the n-type impurity atoms contained in the first n-type layer and/or the second n-type layer are any one kind of, or a combination of two or more kinds of, those selected from the group consisting of silicon (Si), germanium (Ge), sulfur (S), selenium (Se), tin (Sn) and tellurium (Te).

18. An n-type Group III nitride semiconductor stacked layer structure according to claim 17, wherein the n-type impurity atoms are any one kind of, or a combination of two or more kinds of, those selected from the group consisting of silicon (Si), germanium (Ge) and tin (Sn).

19. A Group III nitride semiconductor light-emitting device having a light-emitting layer comprising a Group III nitride semiconductor on a substrate, and having an n-type Group III nitride semiconductor stacked layer structure, according to claim 1, between the substrate and the light-emitting layer.

20. A lamp comprising a Group III nitride semiconductor light-emitting device according to claim 19.

21. A lamp comprising a Group III nitride semiconductor light-emitting device according to claim 19 and a fluorescent material.

22. An electronic device incorporating a lamp according to claim 20.

23. A machine incorporating an electronic device according to claim 22.

24. A toy incorporating an electronic device according to claim 22.

* * * * *